United States Patent
Shinohara et al.

(10) Patent No.: US 7,529,994 B2
(45) Date of Patent: May 5, 2009

(54) ANALYSIS APPARATUS AND ANALYSIS METHOD

(75) Inventors: Makoto Shinohara, Tokyo (JP); Katsuhito Nagano, Tokyo (JP)

(73) Assignee: Advantest Corporation, Tokyo (JP)

( * ) Notice: Subject to any disclaimer, the term of this patent is extended or adjusted under 35 U.S.C. 154(b) by 287 days.

(21) Appl. No.: 11/657,381

(22) Filed: Jan. 24, 2007

(65) Prior Publication Data
US 2007/0240022 A1    Oct. 11, 2007

(30) Foreign Application Priority Data
Jan. 25, 2006   (JP)   ............... 2006-016794

(51) Int. Cl.
*G01R 31/28* (2006.01)
(52) U.S. Cl. ........................ 714/727; 714/37
(58) Field of Classification Search .................. 714/37, 714/726, 724, 25, 729, 727
See application file for complete search history.

(56) References Cited

U.S. PATENT DOCUMENTS

| | | | | |
|---|---|---|---|---|
| 5,574,733 | A * | 11/1996 | Kim ........................... | 714/728 |
| 5,881,067 | A * | 3/1999 | Narayanan et al. .......... | 714/726 |
| 7,139,948 | B2 * | 11/2006 | Rearick et al. .............. | 714/726 |
| 2004/0078683 | A1 * | 4/2004 | Buia et al. .................... | 714/37 |
| 2008/0163020 | A1 * | 7/2008 | Cooke et al. ................ | 714/731 |

FOREIGN PATENT DOCUMENTS

| | | |
|---|---|---|
| JP | 9-159726 | 6/1997 |
| JP | 2001-337138 | 12/2001 |
| JP | 2005-347713 | 12/2005 |

OTHER PUBLICATIONS

Patent Abstracts of Japan, Publication No. 9-159726, Publication Date: Jun. 20, 1997, 2 pages.
Japanese PCT International Search Report for PCT/JP2007/050949, mailed Mar. 6, 2007, and English translation thereof, 10 pages.

\* cited by examiner

*Primary Examiner*—David Ton
(74) *Attorney, Agent, or Firm*—Osha · Liang LLP (57) ABSTRACT

There is provided an analysis apparatus 30 for analyzing test results of testing, by using a test apparatus, a plurality of devices under test having the same configuration. The analysis apparatus 30 includes: an acquiring unit 300 that acquires a judgment result of comparing, to an expected value, a value of data in storage read out for each flip-flop, the data having been stored as a result of scan testing onto flip-flops provided linked to one another by scan chain connection within the devices under test; a result storage unit 310 that stores the judgment result for each flip-flop in association with a position of the flip-flop in a scan chain; a composite unit 350 that generates a composite result in which a plurality of judgment results for the devices under test are combined with one another for each position in the scan chain; and a display unit 360 that displays the composite result.

10 Claims, 7 Drawing Sheets

ANALYSIS APPARATUS AND ANALYSIS METHOD

CROSS REFERENCE TO RELATED APPLICATION

The present application claims priority from a Japanese Patent Application No. 2006-016794 filed on Jan. 25, 2006, the contents of which are incorporated herein by reference.

BACKGROUND

1. Technical Field

The present invention relates to an analysis apparatus and an analysis method. In particular, the present invention relates to an analysis apparatus and an analysis method for analyzing test results of testing a plurality of devices under test having the same configuration.

2. Related Art

When launching a production line of a semiconductor device, the state of the production line is analyzed for adjustment of the production line at the initial stage after the manufacturing start. In the analysis of this state, it is effective to analyze variations and distributions of places where failure has occurred for a plurality of semiconductor products produced on the production line. Such an analysis facilitates analysis of the cause of defects for the semiconductor products.

For such an analysis, places where failure has occurred have been counted manually for each semiconductor device. For example, engineers prepare printed materials describing thereon places where failure has occurred for each semiconductor product, and make comparison by overlaying the printed materials to inspect through them. Moreover, engineers manually input data showing places where failure has occurred using general spreadsheet software, for calculating the statistical information regarding the places where failure has occurred and its frequency.

Causes of defects of a semiconductor product are classified into those attributable to production processes and those attributable to physical designing. If the cause is attributable to production processes, semiconductor products diced from different wafers from each other may turn out to be defective in the same way if the positions of the semiconductor products on wafers are the same, for example. On the other hand, if the cause is attributable to physical designing, a plurality of semiconductor products positioned differently on a wafer may have the same defect at respective portions having the same logical positioning with one other in terms of physical designing. In this way, semiconductor products have their own unique factors of fault occurrences, and the general spreadsheet software was not able to help investigating such factors or causes. In addition, it is a great burden for engineers if investigation of the cause is attempted manually due to a great amount of data to be dealt with.

As a reference purpose, the Japanese Patent Application Publication No. H09-159726 discloses a technology of utilizing a scan chain for the purpose of expediting analysis of a test result.

SUMMARY

In view of this, an advantage of the present invention is to provide an analysis apparatus and an analysis method that are able to solve the foregoing problems. This advantage is achieved by combinations of features described in the independent claims. The dependent claims define further advantageous and exemplary combinations of the present invention.

So as to solve the foregoing problems, according to the first aspect of the present invention, there is provided an analysis apparatus for analyzing test results of testing, by using a test apparatus, a plurality of devices under test having the same configuration, the analysis apparatus including: an acquiring unit that acquires a judgment result of comparing, to an expected value, a value of data in storage read out for each flip-flop, the data having been stored as a result of scan testing onto flip-flops provided linked to one another by scan chain connection within the devices under test; a result storage unit that stores the judgment result for each flip-flop in association with a position of the flip-flop in a scan chain; a composite unit that generates a composite result in which a plurality of judgment results for the devices under test are combined with one another for each position in the scan chain; and a display unit that displays the composite result.

In addition, the display unit may display the composite result in such a manner that a number of flip-flops judged as defective is identifiable at respective positions in the scan chain.

Furthermore, a configuration is also possible in which each of the devices under test includes a plurality of scan chains, and the composite unit generates a two-dimensional composite result in which a first coordinate axis on a display surface of the display unit represents each of the scan chains, and the second coordinate axis on the display surface represents positions of the flip-flops in the scan chains.

Moreover, a configuration is also possible in which the result storage unit stores the judgment result for each of the devices under test, and the composite unit generates the composite result based on a judgment result that corresponds to a device under test selected in advance.

Moreover, it is also possible to further include: a counting unit that counts a number of flip-flops judged as defective for each of the devices under test; and a composite control unit that notifies the composite unit of devices under test of which the number of defective flip-flops counted by the counting unit is no more than a predetermined number, and controls the composite unit to generate the composite result based on judgment results corresponding to the notified devices under test.

Furthermore, a configuration is also possible in which the plurality of devices under test tested by the test apparatus are formed on a same wafer, the result storage unit further stores the judgment results in association with positions of the devices under test on the wafer, and the composite control unit further notifies the composite unit of devices under test formed, on the wafer, adjacent to the devices under test of which the number of defective flip-flops counted by the counting unit is no less than a predetermined number, and controls the composite unit to generate the composite result further based on judgment results corresponding to the further notified devices under test.

Furthermore, a configuration is also possible in which the plurality of devices under test tested by the test apparatus are formed on a same wafer, the result storage unit further stores the judgment results in association with positions of the devices under test formed on the wafer, and the composite unit generates the composite result based on judgment results of devices under test corresponding to a pre-designated position on the wafer.

Moreover, a configuration is also possible which further includes a division unit that divides the plurality of devices under test into a plurality of groups, according to positions of the plurality of devices under test on the wafer, where the composite unit generates the composite result for each of the groups.

The test apparatus sequentially may test the plurality of devices under test, and the composite unit, every time a new judgment result is acquired, combines the new judgment result onto an already generated composite result.

According to the second aspect of the present invention, there is provided an analysis method of analyzing test results of testing, by using a test apparatus, a plurality of devices under test having the same configuration, the analysis method including: acquiring a judgment result of comparing, to an expected value, a value of data in storage read out for each flip-flop, the data having been stored as a result of scan testing onto flip-flops provided linked to one another by scan chain connection within the devices under test; storing the judgment result for each flip-flop in association with a position of the flip-flop in a scan chain; generating a composite result in which a plurality of judgment results for the devices under test are combined with one another for each position in the scan chain; and displaying the composite result.

The summary of the invention does not necessarily describe all necessary features of the present invention. The present invention may also be a sub-combination of the features described above.

DESCRIPTION OF EXEMPLARY EMBODIMENTS

As follows, the present invention is described based on some embodiments that do not intend to limit the scope of the present invention. All of the features and combinations thereof disclosed in the following are not necessarily essential to means provided by the aspects of the invention.

Figure 1:
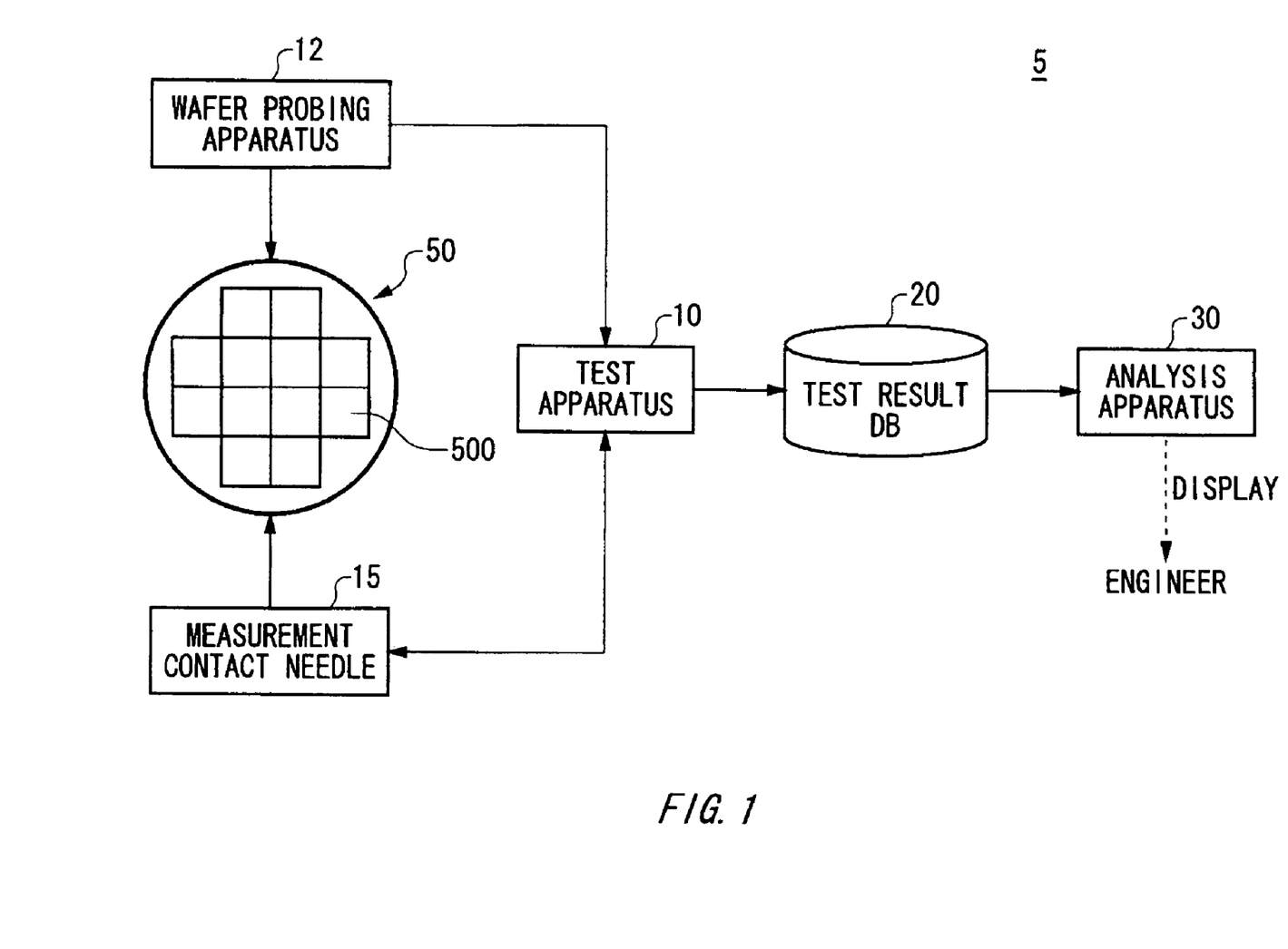
FIG. 1 illustrates an entire configuration of a system 5 for analyzing a test result of testing a device under test 500.

FIG. 1 illustrates an entire configuration of a system 5 for testing a test result of analyzing a device under test 500. The system 5 is equipped with a test apparatus 10, a wafer probing apparatus 12, a measurement contact needle 15, a test result DB (database) 20, and an analysis apparatus 30. The test apparatus 10 tests a plurality of devices under test 500 formed on a wafer 50. The wafer probing apparatus 12 and the measurement contact needle 15 are used in the test. Specifically, the wafer probing apparatus 12 sequentially changes the setting position of the wafer 50. In addition, the measurement contact needle 15 comes into electric contact with a device under test 500 sequentially moved by the wafer probing apparatus 12. The test apparatus 10 supplies a test signal to a device under test 500 through the measurement contact needle 15, and acquires an output signal from a device under test 500 through the measurement contact needle 15.

The test apparatus 10 judges whether a device under test 500 is defective or non-defective, by comparing the acquired output signal with an expected-value signal. When the wafer 50 contains a plurality of devices under test 500, the test apparatus 10 may test the plurality of devices under test 500 formed on the same wafer 50. By acquiring the setting position of the wafer 50 from the wafer probing apparatus 12, the test apparatus 10 identifies a device under test 500 to be tested or detects the position of the device under test 500 on the wafer 50. The test result DB 20 stores a test result of the test apparatus 10. The test result DB 20 may store the test result after data compression thereto. The analysis apparatus 30 reads the test result from the test result DB 20, analyzes the read test result, and detects faults of the device under test 500 caused during the production processes or during the physical designing.

Figure 2:
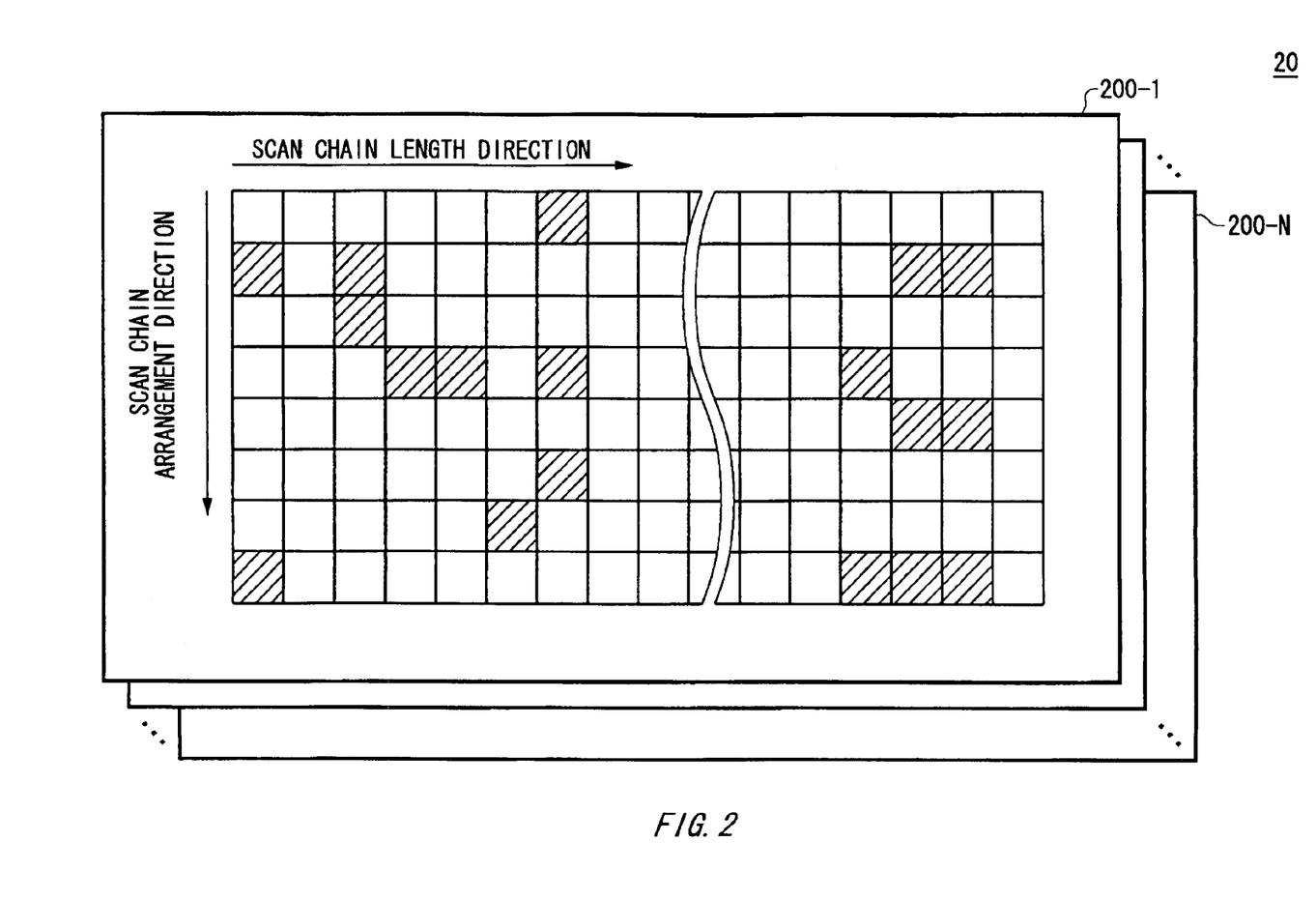
FIG. 2 is a conceptual diagram showing data stored in a test result DB (database) 20.

FIG. 2 is a conceptual diagram showing data stored in the test result DB 20. The test result DB 20 stores test results for devices under test respectively. Here, the test results for the devices under test are respectively set as test result data from 200-1 to 200-N. FIG. 2 shows details of test result data 200-1 as a representative of them. The horizontal axis represents a plurality of flip-flops provided for the device under test 500 linked by means of a scan chain. The vertical axis represents a plurality of scan chains owned by the device under test 500. Each intersection between the vertical axis and the horizontal axis shows a judgment result of a corresponding flip-flop. What is meant by "judgment result" here is a result of comparing, to an expected value, a value of data in storage read out from a corresponding flip-flop, where the data has been stored as a result of scan testing for the device under test 500. A slanting line in the drawing indicates that the value read from the flip-flop does not correspond to the expected value.

Figure 3:
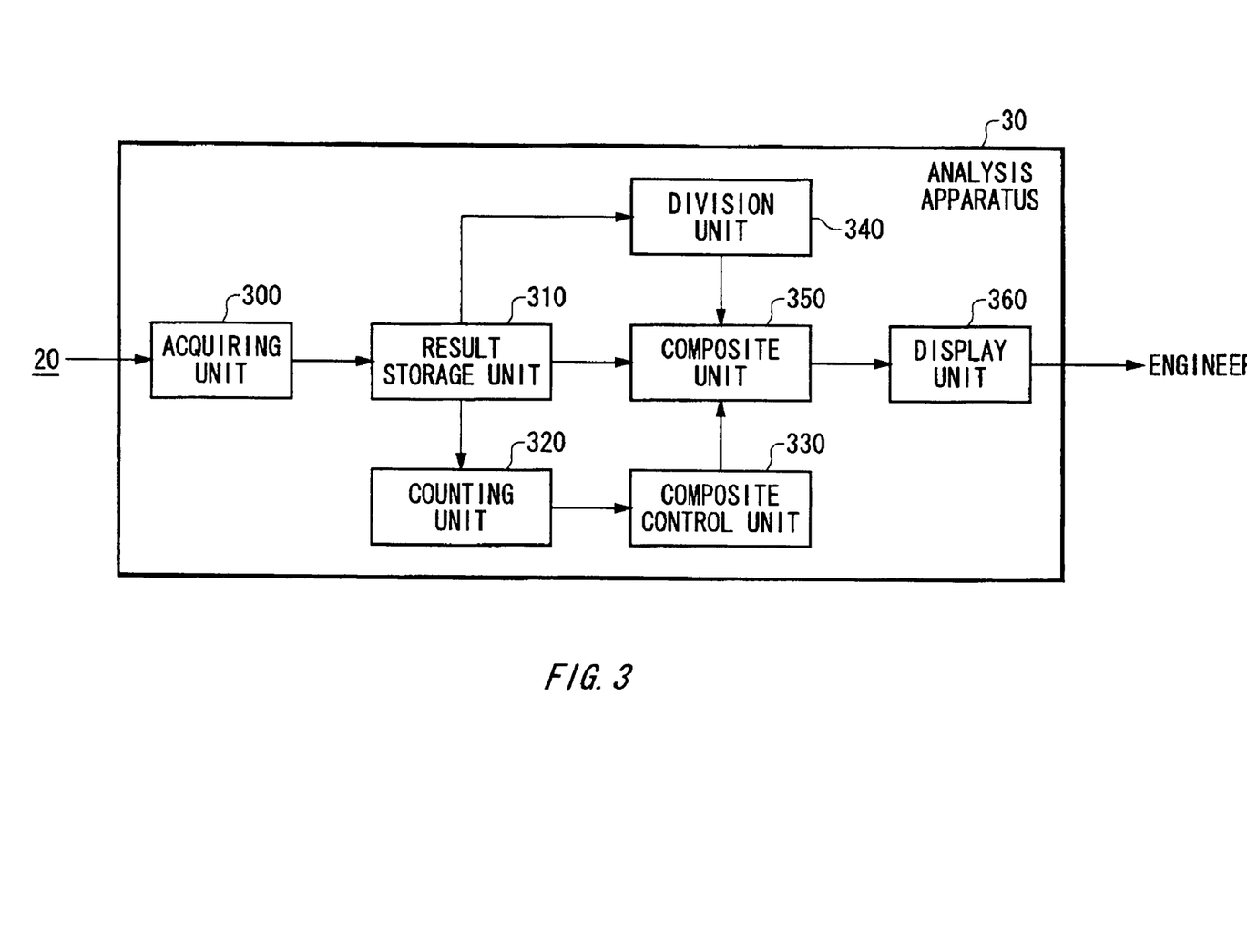
FIG. 3 shows a functional configuration of an analysis apparatus 30.

FIG. 3 shows a functional configuration of the analysis apparatus 30. The analysis apparatus 30 includes an acquiring unit 300, a result storage unit 310, a counting unit 320, and a composite control unit 330, a division unit 340, a composite unit 350, and a display unit 360. The acquiring unit 300 acquires a judgment result regarding each flip-flop. The result storage unit 310 stores, for each device under test 500, judgment results of flip-flops included in the device under test 500 in association with their positions in the scan chains. Preferably, the result storage unit 310, for each device under test 500, stores the judgment results further in association with their positions on a wafer that contains the device under test 500.

The counting unit 320 counts the number of flip-flops judged as defective for each device under test 500. The composite control unit 330 may notify the composite unit 350 of devices under test of which the number of defective flip-flops counted by the counting unit 320 is no more than a predetermined number, and control the composite unit 350 to generate a composite result based on the judgment results corresponding to the notified devices under test. By doing so, devices under test 500 having undergone many unexpected faults are able to be excluded from targets of composite unit, thereby making it easier to pursue the cause of defects caused on other devices under test 500.

The composite control unit 330 may further notify the composite unit 350 of devices under test formed adjacent to the devices under test of which the number of defective flip-flops on the wafer 50 counted by the counting unit 320 is no less than the predetermined number. In this case, the composite control unit 330 controls a composite result to be generated based further on the judgment results corresponding to the devices under test further notified. By doing so, it becomes possible to set devices under test 500 positioned around a boundary between a defect-prone position (position at which defect is likely) and a position at which defect is unlikely. This helps adjust production processes.

The division unit 340 divides a plurality of devices under test 500 into a plurality of groups based on their positions on respective wafers 50. For example, the division unit 340 may select, from respective wafers 50, devices under test 500 whose positions are the same across the wafers 50, and classify the selected devices under test 500 into one group. Alternatively, the division unit 340 may classify devices under test 500 positioned on the periphery of wafers 50 into one group, and other devices under test 500 positioned inside the periphery as another group. The composite unit 350 selects devices under test 500 based on a notification received from the composite control unit 330. Then the composite unit 350 generates a composite result in which judgment results for the flip-flops of the selected devices under test 500 are combined for each group and further for each position in scan chains. The display unit 360 displays the composite result in such a manner that the number of flip-flops judged defective is identifiable at respective positions in the scan chains.

Figure 4:
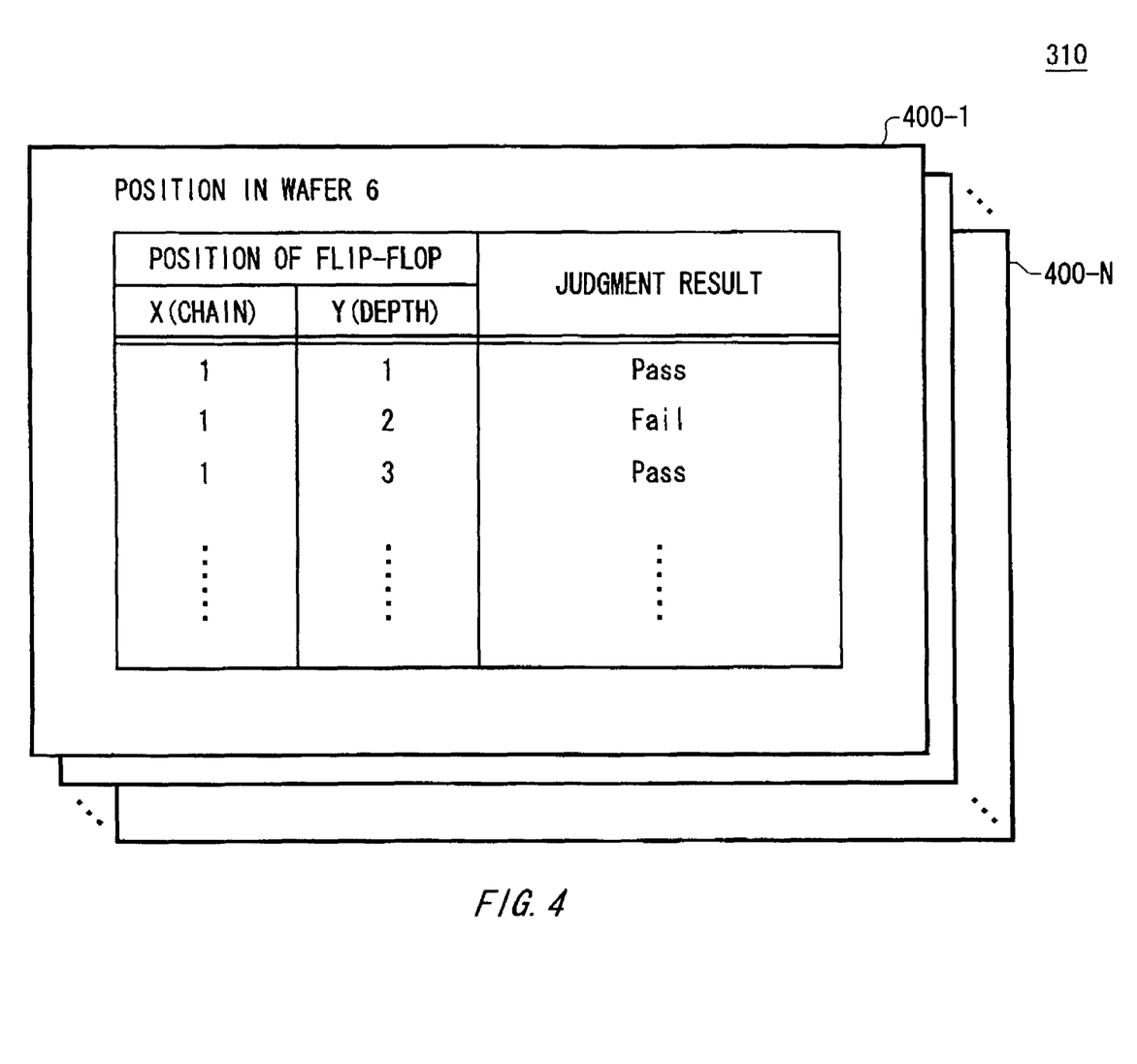
FIG. 4 shows one example of a data structure of a result storage unit 310.

FIG. 4 shows one example of a data structure of the result storage unit 310. The result storage unit 310 stores the judgment result data 400-1-400-N showing judgment results of devices under test 500 respectively. FIG. 4 illustrates judgment result data 400-1 as a representative of them. The judgment result data 400-1 stores a judgment result of each flip-flop contained in a device under test 500, in association with a position at which the flip-flop is positioned in the scan chain. Furthermore, the judgment result data 400-1 stores the position of the device under test 500 on the wafer 50.

In more detail, the judgment result data 400-1 stores, as the position of each flip-flop in a scan chain, the order (X) in the arrangement direction of the scan chain and the order (Y) in the depth direction of the scan chain. For example, the flip-flop linked to the first depth of the scan chain arranged first is judged as non-defective (as represented as "Pass" in the drawing). On the other hand, the flip-flop linked to the second depth of the same scan chain is judged as defective (as represented as "Fail" in the drawing). Moreover, the flip-flop linked to the third depth of the same scan chain is judged as non-defective ("Pass" in the drawing). Additionally, the device under test 500 corresponding to the judgment result data 400-1 is positioned on the wafer 50 in the sixth place. Here, the number representing the position of a device under test 500 in a wafer 50 is assumed to have been predetermined in association with the position.

Figure 5:
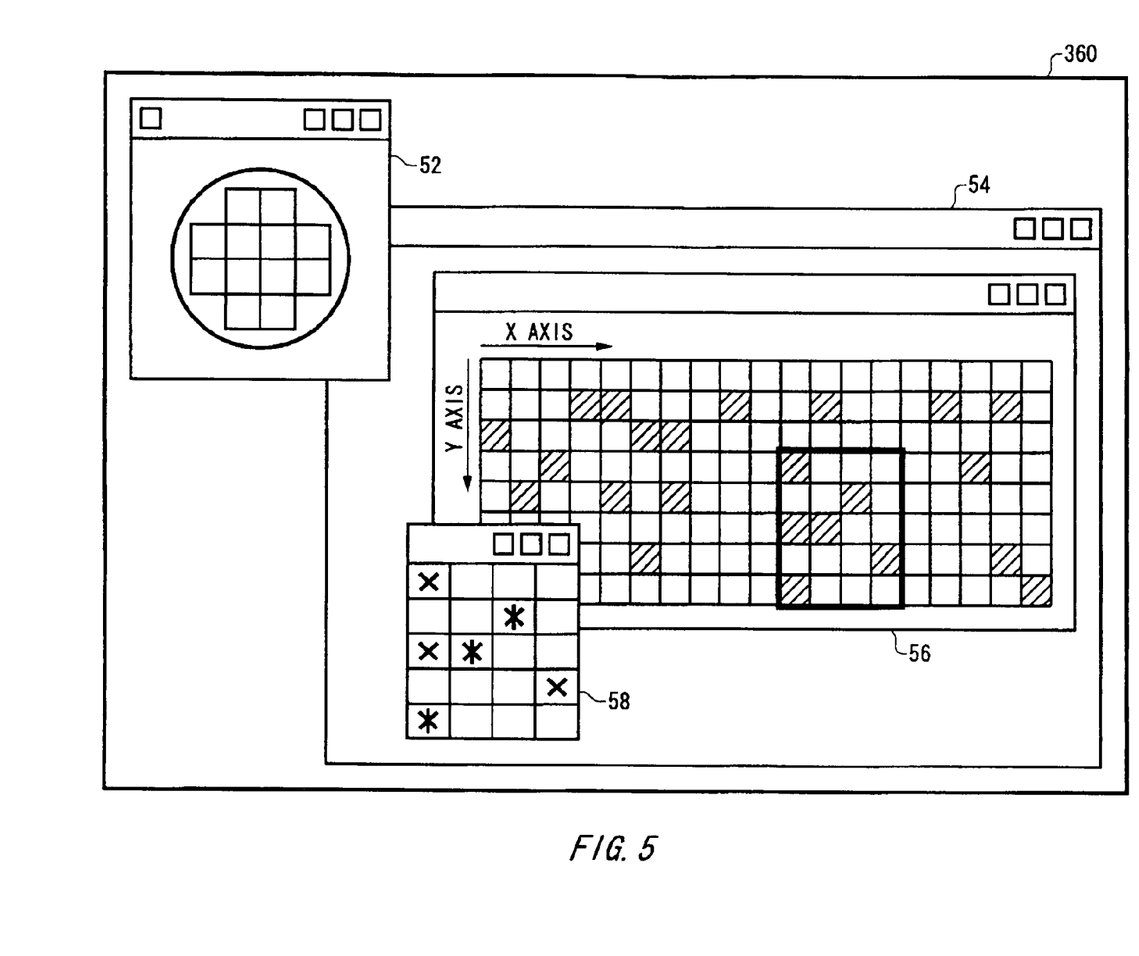
FIG. 5 shows one example of a display screen of a display unit 360.

FIG. 5 shows one example of the display screen of the display unit 360. The display unit 360 displays a window 52 and a window 54 on the display surface thereof. In the window 52, the composite unit 350 schematically displays positions, in a wafer 50, of a plurality of devices under test 500 being targets of composite unit. In addition, the composite unit 350 generates a two-dimensional composite result in which the first coordinate axis (e.g. Y axis) represents each scan chain, and the second coordinate axis (e.g. X axis) represents a position of a flip-flop in each scan chain, in the window 56 within the window 54. The slanting line in the composite result indicates a flip-flop having caused malfunction in one or more devices under test 500.

In addition, the display unit 360 may display an enlarged screen of a part of the window 56, within the window 58 in the window 54. In the window 58, the display unit 360 performs display in such a manner that the number of flip-flops judged as defective is identifiable. In the drawing, the mark "*" indicates occurrence of defect in two or more devices under test 500, and the mark "x" indicates occurrence of defect in one device under test 500. In addition, flip-flops without any mark indicate that these flop flops did not experience any defect within any device under test 500. The display unit 360 may indicate the number of flip-flops judged defective by changing colors. By such a display, a user is able to intuitively recognize defect-prone positions of scan chains.

Furthermore, the composite unit 350 may display each device under test 500 selectable in the window 52. Furthermore, the composite unit 350 may allow a user to operate a pointing device such as a mouse for example, for the purpose of selecting a plurality of devices under test 500 displayed in the window 52. In this case, the division unit 340 classifies the devices under test 500 selected by a user as one group separately from the other devices under test 500. In response, the composite unit 350 generates for display a composite result for the group of the selected devices under test 500. Accordingly, it becomes easy for a user to select devices under test 500 to be combined, by referring to the position of devices under test 500 within a wafer 50.

Figure 6:
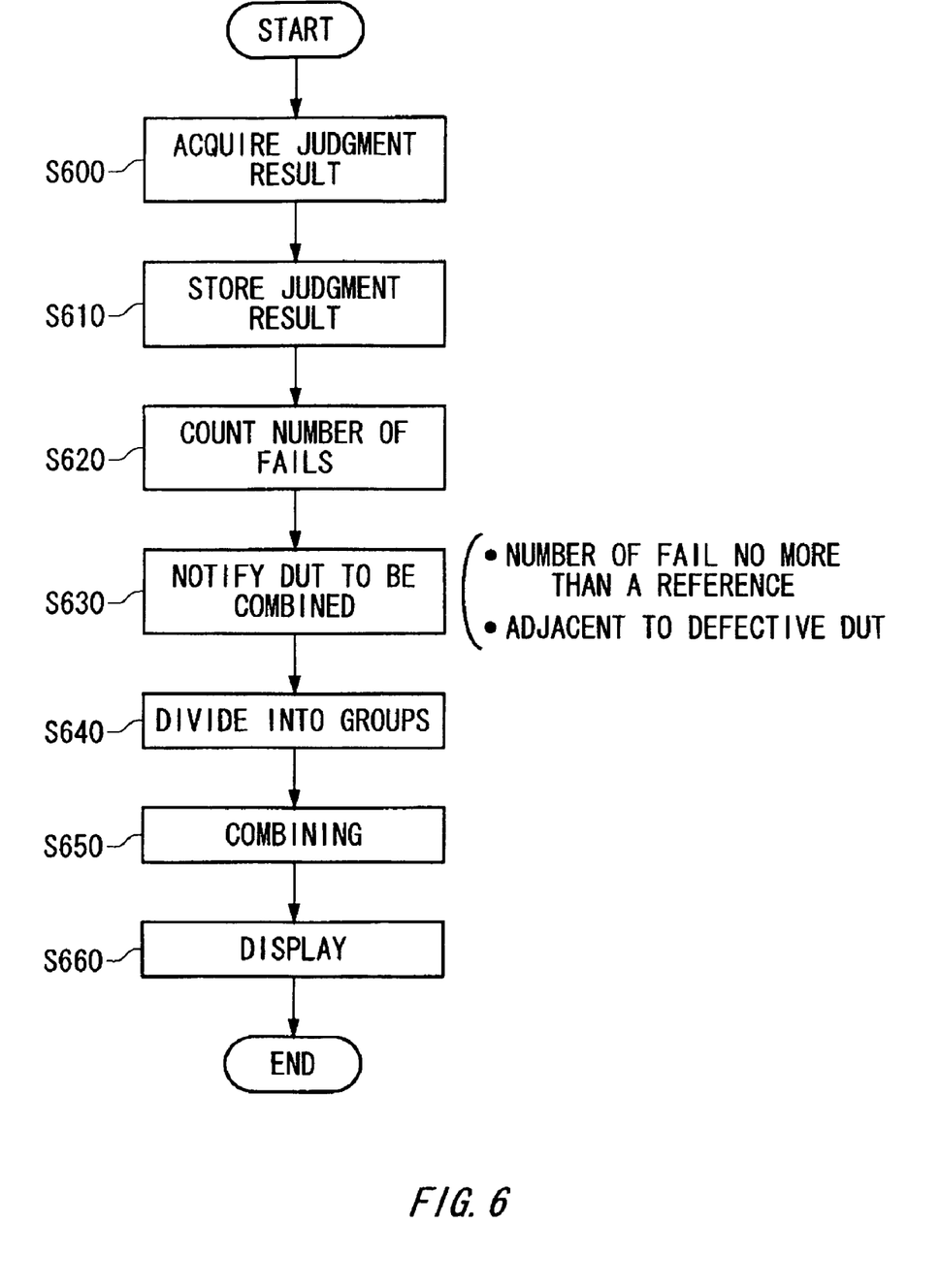
FIG. 6 is a flowchart of processes for analyzing a test result by means of the analysis apparatus 30.

FIG. 6 is a flowchart of processes for analyzing a test result by means of the analysis apparatus 30. The acquiring unit 300 acquires a judgment result for each flip-flop (S600). The result storage unit 310 stores, for each device under test 500, a judgment result for each flip-flop contained in the device under test 500 in association with the position in a scan chain (S610).

The counting unit 320 counts the number of flip-flops judged as defective (i.e. the number of "Fail") for each device under test 500 (S620). The composite control unit 330 notifies the composite unit 350 of devices under test of which the number of defective flip-flops counted by the counting unit 320 is no more than a predetermined number (S630). In addition, the composite control unit 330 further notifies the composite unit 350 of devices under test formed adjacent to the devices under test on the wafer 50 of which the number of defective flip-flops counted by the counting unit 320 is no less than the predetermined number.

The division unit 340 divides a plurality of devices under test 500 into a plurality of groups based on their positions on respective wafers 50 (S640). Then, the composite unit 350 generates a composite result in which judgment results for flip-flops of devices under test 500 are combined for each group and further for each position in scan chains (S650). Instead, the composite unit 350 may generate a composite result based on judgment results for devices under test 500 on a pre-designated position of a wafer, irrespective of groups. Specifically, for example suppose a case where the periphery of a wafer 50 has been designated prior to acquirement of a judgment result. In such a case, the composite unit 350 may generate a composite result for the devices under test 500 positioned on the periphery of the wafer 50. The composite unit 350 may also be able to combine judgment results for each of groups into which devices under test 500 having been classified depending on their distances from the center of a round-shaped wafer 50. The display unit 360 displays the composite result in such a manner that the number of flip-flops judged as defective is identifiable at respective positions of the scan chain (S660).

Figure 7:
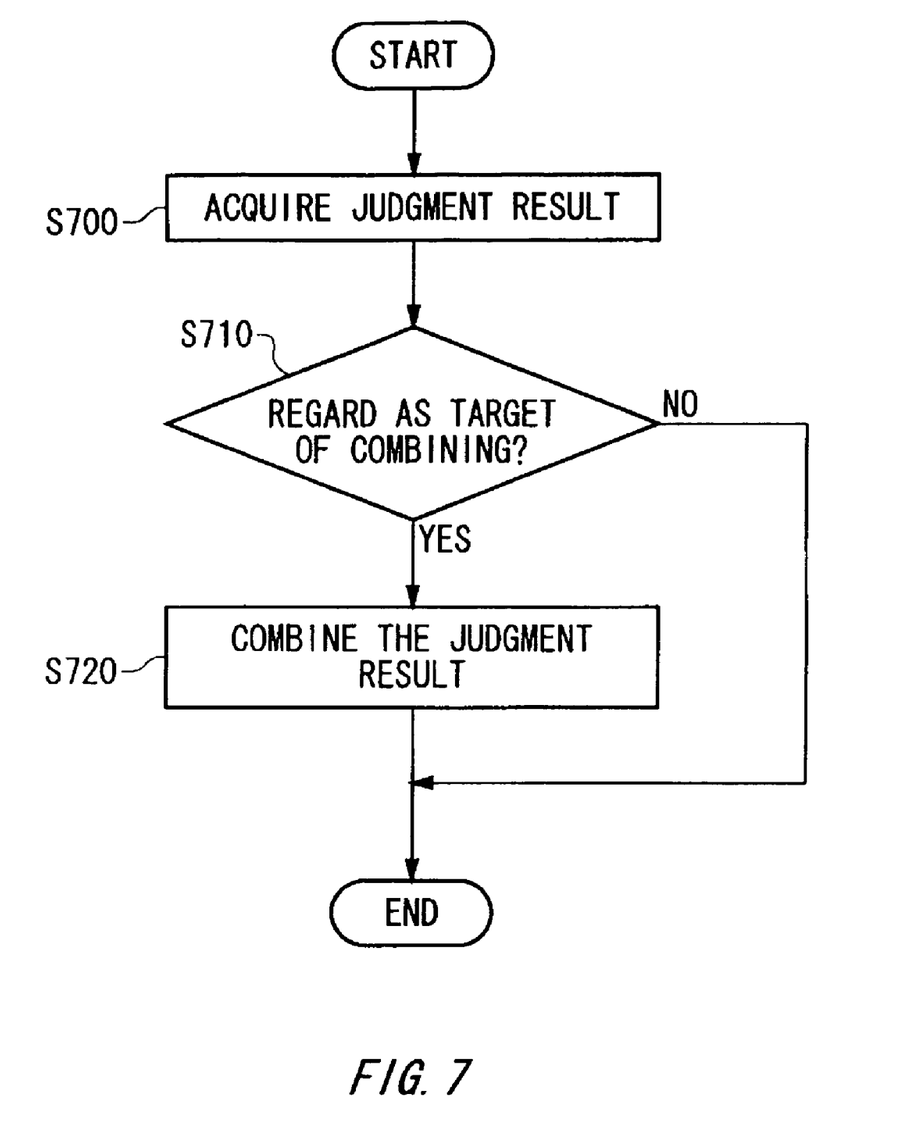
FIG. 7 is a flowchart of processes that are repeated by the analysis apparatus 30, every time a new test result is acquired.

FIG. 7 is a flowchart of processes that are repeated by the analysis apparatus 30, every time a new test result is acquired. The analysis apparatus 30 may perform the processes shown in FIG. 7, either instead of the processes illustrated in FIG. 6 or after the processes illustrated in FIG. 6. It should be noted here that the processes shown in FIG. 7 are executed in parallel with processes for sequentially testing a plurality of devices under test 500 performed by the test apparatus 10.

Every time a new device under test 500 is tested by the test result DB 20, the acquiring unit 300 acquires a judgment result for each flip-flop contained in the device under test 500 (S700). Then the composite unit 350 judges whether the judgment result deserves as a target for composite unit (S710). The judgment may be performed based on the notification issued from the division unit 340, as already explained in S630 in FIG. 6. That is, the composite unit 350 may regard a judgment result as a target for composite unit under a condition that the number of "Fail" is no more than a reference value or that the device under test 500 is adjacent to a defective device under test 500, for example. When a judgment result is regarded as a target for composite unit (S710: YES), the composite unit 350 combines the judgment result of the device under test 500 onto the already generated composite result (S720).

As stated above, by repeating the processes in FIG. 7, it becomes possible to enhance the accuracy of a composite result sequentially as the test operation progresses, even when not all the tests are completed.

As explained above with reference to the drawings from FIG. 1 to FIG. 7, the analysis apparatus 30 is able to combine defects of flip-flops caused in a device under test 500, taking into account a plurality of viewpoints such as the position of the flip-flops on scan chains and the position of the device under test 500 on a wafer 50. Moreover, the result of composite unit is displayed in an easily comprehensible manner by means of symbols, colors, and so on, contributing to the improvement in adjustment of the production line and the physical designing. Furthermore, it becomes possible to select devices under test 500 capable of contributing to finding a cause of defect exclusively, by automatically selecting devices under test 500 as composite unit targets depending on the number of defects or the like. This leads to reduction in work burden on engineers.

In the above, the present invention has been described by way of an exemplary embodiment. However, it is needless to say that the technical scope of the present invention should not be limited by the above-described embodiment. It should be understood that those skilled in the art might make many changes and substitutions without departing from the spirit and the scope of the present invention. It is obvious from the appended claims that embodiments with such modifications also belong to the scope of the present invention.

As clear from the above description, it becomes possible to realize an analysis apparatus and an analysis method for efficiently analyzing the cause of defect caused in a semiconductor device, according to some aspect of the present invention.

What is claimed is:

1. An analysis apparatus for analyzing test results of testing, by using a test apparatus, a plurality of devices under test having the same configuration, the analysis apparatus comprising:
   an acquiring unit that acquires a judgment result of comparing, to an expected value, a value of data in storage read out for each flip-flop, the data having been stored as a result of scan testing onto flip-flops provided linked to one another by scan chain connection within the devices under test;
   a result storage unit that stores the judgment result for each flip-flop in association with a position of the flip-flop in a scan chain;
   a composite unit that generates a composite result in which a plurality of judgment results for the devices under test are combined with one another for each position in the scan chain; and
   a display unit that displays the composite result.

2. The analysis apparatus as set forth in claim 1, wherein the display unit displays the composite result in such a manner that a number of flip-flops judged as defective is identifiable at respective positions in the scan chain.

3. The analysis apparatus as set forth in claim 1, wherein
   each of the devices under test includes a plurality of scan chains, and
   the composite unit generates a two-dimensional composite result in which a first coordinate axis on a display surface of the display unit represents each of the scan chains, and the second coordinate axis on the display surface represents positions of the flip-flops in the scan chains.

4. The analysis apparatus as set forth in claim 1, wherein
   the result storage unit stores the judgment results according to each of the devices under test, and
   the composite unit generates the composite result based on judgment results that correspond to devices under test selected in advance.

5. The analysis apparatus as set forth in claim 4, further comprising:
   a counting unit that counts a number of flip-flops judged as defective for each of the devices under test; and
   a composite control unit that notifies the composite unit of devices under test of which the number of defective flip-flops counted by the counting unit is no more than a predetermined number, and controls the composite unit to generate the composite result based on judgment results corresponding to the notified devices under test.

6. The analysis apparatus as set forth in claim 5, wherein
   the plurality of devices under test tested by the test apparatus are formed on a same wafer,
   the result storage unit further stores the judgment results in association with positions of the devices under test on the wafer, and
   the composite control unit further notifies the composite unit of devices under test formed, on the wafer, adjacent to devices under test of which the number of defective flip-flops counted by the counting unit is no less than a predetermined number, and controls the composite unit to generate the composite result further based on judgment results corresponding to the further notified devices under test.

7. The analysis apparatus as set forth in claim 1, wherein
   the plurality of devices under test tested by the test apparatus are formed on a same wafer,
   the result storage unit further stores the judgment results in association with positions of the devices under test on the wafer, and
   the composite unit generates the composite result based on judgment results of devices under test corresponding to a pre-designated position on the wafer.

8. The analysis apparatus as set forth in claim 7, further comprising:
   a division unit that divides the plurality of devices under test into a plurality of groups, according to positions of the plurality of devices under test on the wafer, wherein
   the composite unit generates the composite result according to each of the groups.

9. The analysis apparatus as set forth in claim 1, wherein
   the test apparatus sequentially tests the plurality of devices under test, and
   the composite unit, every time a new judgment result is acquired, combines the new judgment result onto an already generated composite result.

10. An analysis method of analyzing test results of testing, by using a test apparatus, a plurality of devices under test having the same configuration, the analysis method comprising:

acquiring a judgment result of comparing, to an expected value, a value of data in storage read out for each flip-flop, the data having been stored as a result of scan testing onto flip-flops provided linked to one another by scan chain connection within the devices under test;

storing the judgment result for each flip-flop in association with a position of the flip-flop in a scan chain;

generating a composite result in which a plurality of judgment results for the devices under test are combined with one another for each position in the scan chain; and displaying the composite result.

* * * * *